(12) United States Patent
Walker et al.

(10) Patent No.: US 6,977,424 B1
(45) Date of Patent: Dec. 20, 2005

(54) ELECTRICALLY PUMPED SEMICONDUCTOR ACTIVE REGION WITH A BACKWARD DIODE, FOR ENHANCING OPTICAL SIGNALS

(75) Inventors: Jeffrey D. Walker, El Cerrito, CA (US); Daniel A. Francis, Oakland, CA (US); Peter W. Evans, Tracy, CA (US); Paul Liu, Fremont, CA (US)

(73) Assignee: Finisar Corporation, Sunnyvale, CA (US)

( * ) Notice: Subject to any disclaimer, the term of this patent is extended or adjusted under 35 U.S.C. 154(b) by 62 days.

(21) Appl. No.: 10/392,599

(22) Filed: Mar. 18, 2003
(Under 37 CFR 1.47)

Related U.S. Application Data

(60) Provisional application No. 60/365,463, filed on Mar. 18, 2002, provisional application No. 60/365,464, filed on Mar. 18, 2002.

(51) Int. Cl.[7] .......................................... H01L 31/0232
(52) U.S. Cl. ...................... 257/432; 257/623; 257/625; 257/80; 257/81; 257/82; 257/12
(58) Field of Search ................................ 257/623, 625, 257/80, 81, 82, 12

(56) References Cited

U.S. PATENT DOCUMENTS 6,730,990 B2 * 5/2004 Kondo et al. ............... 257/623

OTHER PUBLICATIONS

"88°, Continuous-Wave Operation of 1.55 μm Vertical-Cavity Surface-Emitting Lasers." By Eric Hall, et al. Electrical and Computer Engineering Dept., University of California. Santa Barbara, CA 93106. 1 pg.

"1-mW CW-RT. Monolithic VCSEL at 1.55. μm." by J. Boucart, et al. IEEE Photonics Technology Letters, vol. 11, No. 6. Jun. 1999. pp. 629-631.

"Lateral Electron Current Operation of Vertical Cavity Surface Emitting Lasers with Buried Tunnel Contact Hole Sources." By J.J. Wierer et al. Electrical Engineering Research Laboratory and Center for Compound Semiconductor Microelectronics, University of Illinois at Urbana-Champaign. Urbana, Illinois 61801. vol. 71. No. 24. Dec. 15, 1997. pp. 3468-3470.

* cited by examiner

*Primary Examiner*—David Nelms
*Assistant Examiner*—Mai-Huong Tran
(74) *Attorney, Agent, or Firm*—Workman Nydegger

(57) ABSTRACT

An electrically pumped optical device includes a semiconductor active region and a backward diode. Both of these structures are located in the current path of the optical device, which is oriented primarily vertically. The active region has a finite extent along at least one lateral dimension. The overall structure improves the electrical performance of the device.

25 Claims, 10 Drawing Sheets

ELECTRICALLY PUMPED SEMICONDUCTOR ACTIVE REGION WITH A BACKWARD DIODE, FOR ENHANCING OPTICAL SIGNALS

CROSS-REFERENCE TO RELATED APPLICATIONS

This application claims priority under 35 U.S.C. § 119 (e) to U.S. Provisional Patent Application Ser. No. 60/365,463, "Electrically Pumped Semiconductor Active Region with a Backward Diode, for Enhancing Optical Signals," by Jeffrey D. Walker et al., filed Mar. 18, 2002; and also claims priority under 35 U.S.C. § 119(e) to U.S. Provisional Patent Application Ser. No. 60/365,464, "Electrically Pumped Semiconductor Active Region with a Backward Diode, for Enhancing Optical Signals," by Jeffrey D. Walker et al., filed Mar. 18, 2002. The subject matter of all of the foregoing is incorporated herein by reference in their entirety.

BACKGROUND OF THE INVENTION

1. Field of the Invention

This invention relates generally to semiconductor structures used to enhance optical signals. More specifically, the semiconductor structure has an active region that is finite in lateral extent. It also has a backward diode. The backward diode preferably is also finite in lateral extent and provides current confinement for the electrical current that pumps the active region.

2. Description of the Related Art

As the result of continuous advances in technology, optical devices are becoming more important and more prevalent. For example, the increasing demand for communications bandwidth has resulted in an increased interest in optical communications systems, including those that transmit data over optical fibers. This, in turn, has resulted in increased demand for optical devices for use in these systems.

One general class of optical devices is those that are based on electrically pumped semiconductor active regions. In these devices, an electrical current pumps the semiconductor active region, resulting in the emission of photons. In one common approach, different layers of material are epitaxially grown on a substrate to form the semiconductor active region and the surrounding structure. The active region can be used for different purposes, depending on the design of the rest of the device. For example, in vertical cavity surface emitting lasers (VCSELs), the active region is located within a vertical laser cavity and acts as the gain medium for the cavity. Pumping above the lasing threshold produces laser radiation that is output through one of the mirrors of the laser cavity. In edge emitting lasers, the laser cavity is oriented longitudinally. In non-lasing semiconductor optical amplifiers (SOAs), the emission of photons amplifies an optical signal passing through the active region. In vertical lasing semiconductor optical amplifiers (VLSOAs), the device has a vertical laser cavity but is used as an amplifier. The laser action within the laser cavity gain clamps the active region. A second optical signal passing through the active region experiences amplification without significant gain saturation. Other devices and uses exist for vertical laser cavities.

One drawback of these devices is they can be difficult to fabricate and operate. Because they support optical modes, they preferably should have good optical performance, such as low optical loss and efficient conversion of electrical energy to optical energy. However, because these devices are electrically pumped, they should also have good electrical performance. For example, the current path through the device preferably has low resistance in order to reduce resistive losses and preferably is channeled through the active region in order to increase the pumping efficiency. There is a need for semiconductor structures with improved optical and/or electrical performance.

SUMMARY OF THE INVENTION

The present invention overcomes the limitations of the prior art by providing an optical device with a current path for electrical current. The current path is primarily vertical. The optical device also includes a semiconductor active region and a backward diode located in the current path. The active region has a finite extent along at least one lateral dimension. The current path is for electrical current that pumps the semiconductor active region to produce emission of photons. The semiconductor active region and the backward diode are integrated on a substrate. The overall structure improves the electrical performance of the device.

In one embodiment, the optical device includes the following regions, arranged in the following vertical order: a first n-doped semiconductor region, a p-doped semiconductor region, and a second n-doped semiconductor region. The semiconductor active region is located between the p-doped semiconductor region and one of the n-doped semiconductor regions. The backward diode is located between the p-doped semiconductor region and the other of the n-doped semiconductor regions. In one design, the backward diode includes a heavily p-doped layer in contact with a heavily n-doped layer.

In variations of this theme, the active region and the backward diode may occur in any order. The active region can be either above or below the backward diode, and can be either before or after the backward diode relative to the current path. The different regions may each include multiple layers, allowing for many possible designs.

In another aspect of the invention, the active region may be finite along one lateral dimension and extended along the other, or finite along both lateral dimensions. The width of the active region can be selected to support a single lateral optical mode of the device. For example, if the optical mode is characterized by a lateral mode width, the width of the active region can be designed to be less than or equal to the lateral mode width. The backward diode can also be finite along the same dimensions as the active region. Additionally, current blocking layers can be located laterally adjacent to the semiconductor active region, thus channeling electrical current through the active region.

Other aspects of the invention include specific devices utilizing the structures described above (e.g., VCSELs, edge-emitting lasers, SOAs and VLSOAs), and methods for fabricating and using these devices and structures.

BRIEF DESCRIPTION OF THE DRAWINGS

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Figure 1:
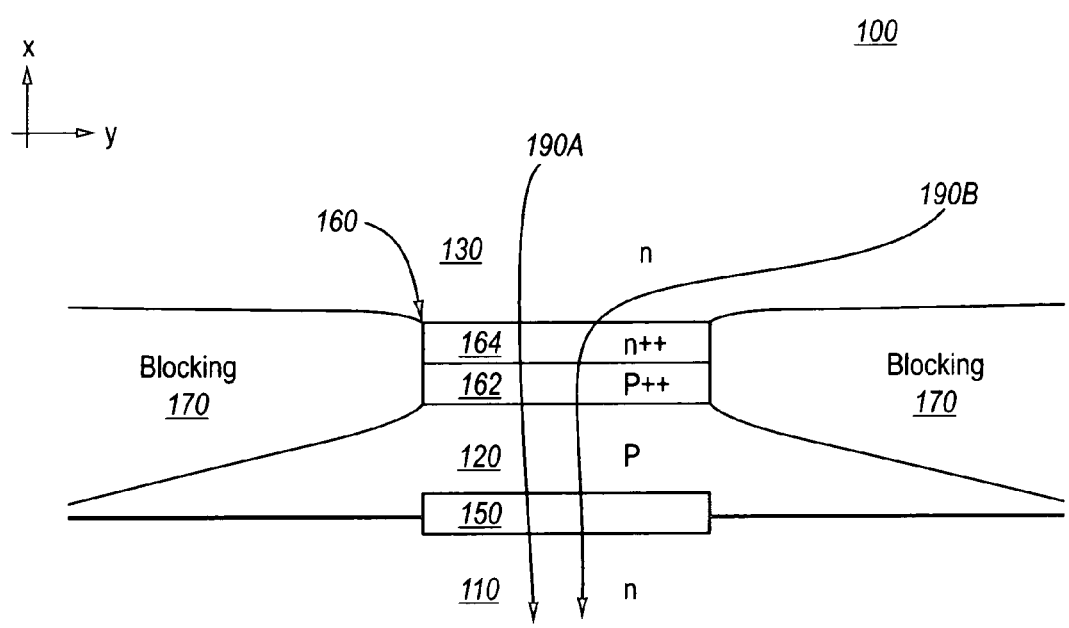
FIG. 1 is a cross-section of a semiconductor structure according to the invention.

FIG. 1 is a cross-section of a semiconductor structure 100 according to the invention. The structure has three layers 110, 120 and 130 that are doped n, p and n, respectively. An active region 150 is located at one p-n interface. A backward diode 160 is located at the other p-n interface. The active region 150 has a finite lateral extent. The backward diode 160 preferably also has a finite lateral extent but can have "infinite" extent in some implementations. The terms "finite" and "infinite" will be further explained below. In some implementations, the structure 100 also includes current blocking layers 170, which are laterally adjacent to the backward diode 160.

The semiconductor structure 100 is used to enhance optical signals propagating through the active region 150. More specifically, a voltage drop is applied between n layer 130 and n layer 110. As a result, an electrical current 190 flows from n layer 130 to n layer 110, passing through active region 150. The current 190 is laterally confined by the backward diode 160, particularly if layers 170 are strongly current blocking. Current confinement is achieved because the backward diode 160 has low resistance with little or no turn-on voltage when biased in the direction shown. By contrast, the blocking layer 170 preferably has high resistivity or high turn-on voltage. In addition, the backward diode 160 and active region 150 typically are located close to each other so the current does not spread significantly between the two features. FIG. 1 shows two example current paths: path 190A where the current is injected at a location that is laterally aligned with the backward diode 160 and active region 150, and path 190B where the current is injected off to the side and must travel laterally to reach the backward diode 160 and active region 150. The current 190 electrically pumps the active region 150, increasing the carrier concentration in the active region. Thus, when an optical signal propagates through the active region 150, it is enhanced by stimulated emission of photons. As will be seen below, structure 100 can be used in many different applications and the optical signal can propagate in many different directions depending on the application.

The active region 150 is "finite" in the following sense. The optical signal propagating through the active region 150 typically is characterized by different modes, including modes for the lateral dimension (the y direction in FIG. 1). These lateral modes are characterized by widths (e.g., full width half max for a Gaussian mode shape). The active region 150 is finite in that the width of the active region 150 is small enough that the active region 150 cannot be accurately modeled as having an infinite width. In other words, the finite width of the active region 150 has some effect on the optical signal. Typically, if the width of the active region 150 is approximately the same or smaller than the width of the optical signal's lateral mode(s), the active region 150 will be finite.

Figure 2:
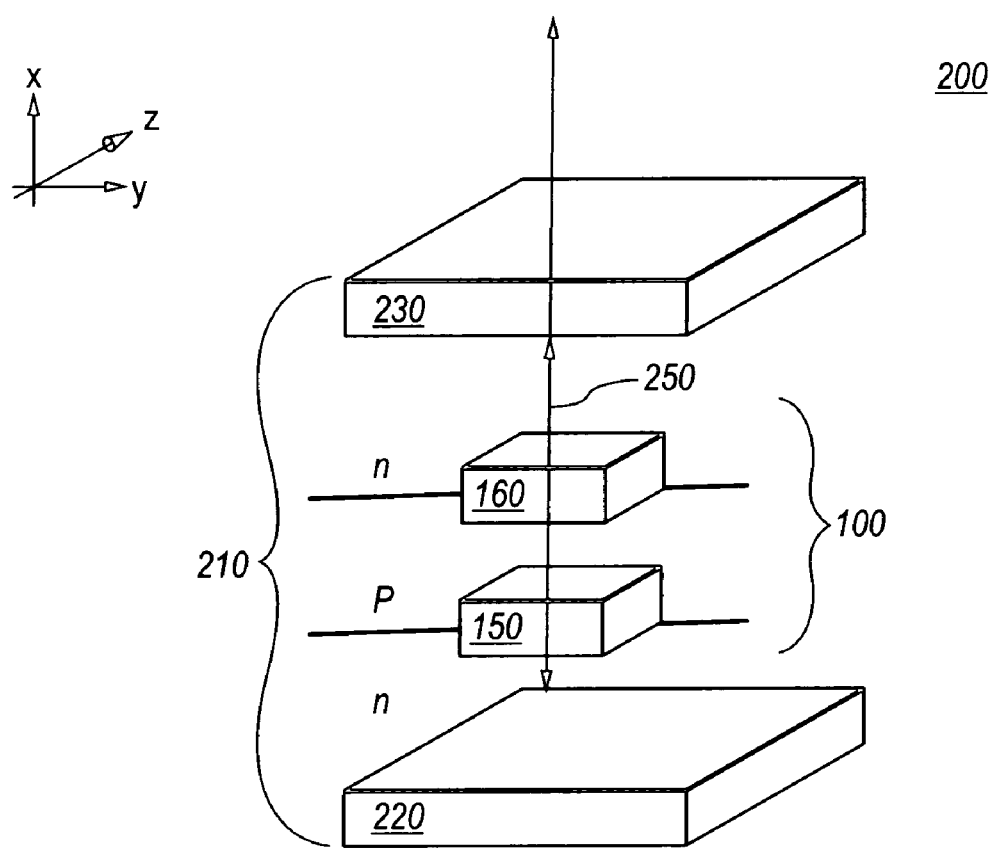
FIG. 2 is a simplified perspective view of a vertical cavity laser using the semiconductor structure of FIG. 1.
Figure 5:
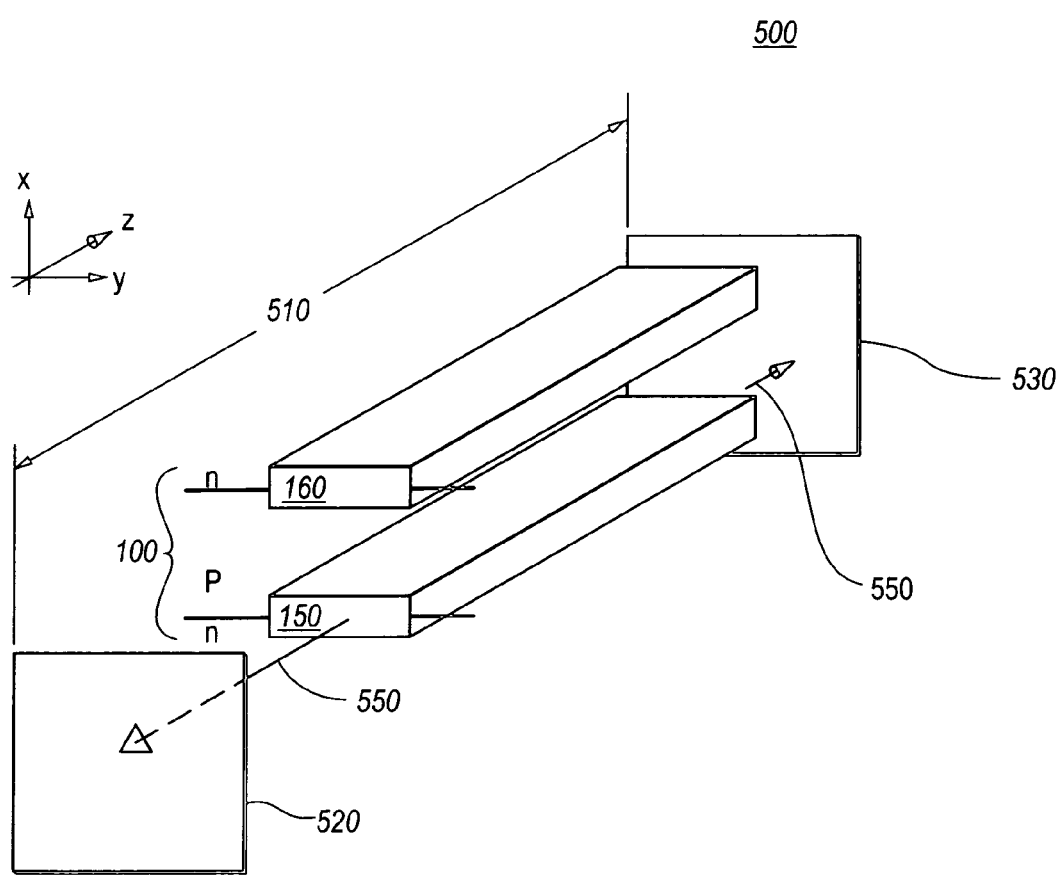
FIG. 5 is a simplified perspective view of an edge-emitting laser using the semiconductor structure of FIG. 1.

For single mode applications (e.g., edge emitting lasers or vertical cavity lasers designed to operate in a single lateral mode), the width is typically less than 5 microns. In edge emitters, such as shown in FIG. 5, the active region 150 typically acts as a waveguide and the width may be selected so that the waveguide only has a single bound mode. This width is typically in the range of 1 to 5 microns at communications wavelengths. For vertical cavity lasers, such as shown in FIG. 2, the width may be selected so that the cavity only supports a single mode. Higher modes typically will have higher diffractive losses and would be extinguished. Widths are typically in the range of 1 to 5 microns at communications wavelengths. For multi mode applications, widths of 10 to 30 microns would be more typical.

In FIG. 1, the backward diode 160 is also shown as finite. It is "finite" in the sense that the active region 150 does not provide significant lateral current confinement beyond what is provided by the backward diode 160. In other words, the backward diode 160 confines the current 190 to a certain lateral width; the active region 150 does not further confine the current to a significantly smaller width. Typically, this will be achieved if the width of the backward diode 160 is approximately the same or smaller than the width of the active region 150.

Throughout this description, "finite" features are depicted as being physically finite. That is, they have a limited physical extent. This is for convenience. Features can be made finite in other ways, for example by processing them in a manner which alters their functionality. As an example, in one implementation, the backward diode 160 may have a large physical extent but portions of the diode may be bombarded with ions in order to damage it and prevent it from functioning as a backward diode. In this way, the backward diode 160 can also be made finite.

The finite active region 150 is beneficial for a number of reasons. First, it typically interacts favorably with the optical signal. The active region 150 typically has a higher refractive index than the surrounding materials. Thus, if the optical signal is propagating in the z direction, the active region 150 can have a waveguiding effect. If the optical signal is propagating in the x direction, the active region 150 can provide some lateral confinement due to the index difference and/or also have a lensing effect. In addition, the active region 150 typically also contributes to current confinement or prevents undesired lateral spreading of the current.

The backward diode 160 is also beneficial. Using a backward diode 160 allows the outer layer 130 in structure 100 to be n type. Without backward diode 160, there would be no layer 130 and the outer layer would be layer 120, which is p-type. An n-type outer layer has advantages over a p-type one. For example, n-type materials usually have better optical transparency than p-types, thus reducing optical loss. N-types typically also have better electrical conductivity. Thus, if the current is laterally injected, as in path 190B, the n-type layer 130 results in less resistive loss and better spreading of the current across the width of the backward diode 160.

FIGS. 2–5 are simplified perspective views illustrating some example devices using structure 100. The figures depict a vertical cavity laser (VCSEL), a vertical lasing semiconductor optical amplifier (VLSOA), a semiconductor optical amplifier (SOA), and an edge-emitting laser, respectively. These are merely examples. The structure 100 can also be used in other types of devices. In addition, the figures are simplified in that they show enough to indicate how the structure 100 can be integrated into a specific device but, for clarity and conciseness, do not show every last detail of the device or all possible variations of the device. In all of these examples, the semiconductor substrate (not shown) on which the device is built is assumed to extend in the y and z directions. Materials that are deposited onto the substrate will extend in the vertical or x direction.

In FIG. 2, the vertical cavity laser 200 includes a vertical optical cavity 210 which in this example is formed by two opposing mirrors 220 and 230. The structure 100 is located in the optical cavity between the two mirrors 220 and 230. The active region 150 provides gain. When the structure 100 is pumped above the lasing threshold, the cavity 210 lases, producing a lasing field 250 within the cavity and a laser output from one of the mirrors. The longitudinal mode of the laser field 250 lies in the x direction; the transverse modes lie in the y and z directions. In the example of FIG. 2, both the active region 150 and the backward diode 160 are finite in both the y and z directions.

Figure 3:
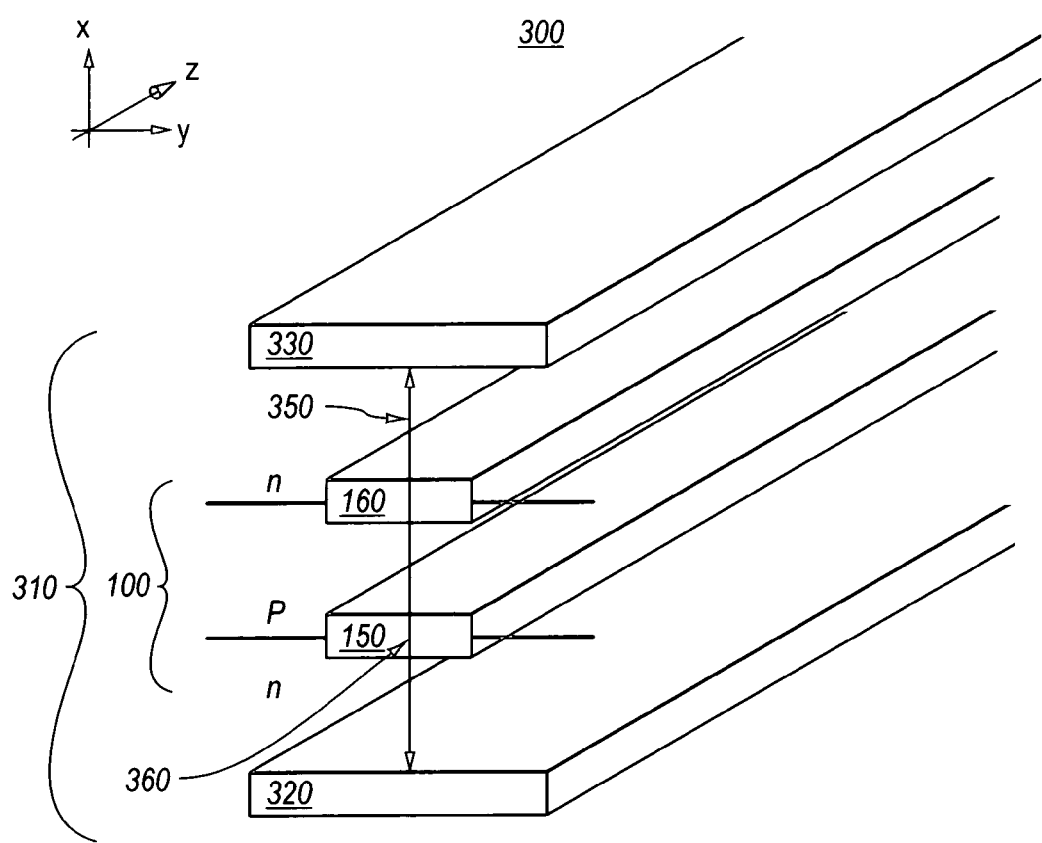
FIG. 3 is a simplified perspective view of a vertical lasing semiconductor optical amplifier using the semiconductor structure of FIG. 1.

In FIG. 3, the VLSOA 300 includes a vertical laser cavity 310 which in this example is formed by two opposing mirrors 320 and 330. The structure 100 is located in the optical cavity between the two mirrors 320 and 330. The active region 150 provides gain. When the structure 100 is pumped above the lasing threshold, the cavity 310 lases producing a laser field 350 within the cavity. In VLSOA 300, both the structure 100 and the laser cavity 310 extend in the z direction. An optical signal 360 propagates along the device in the z direction and is amplified by the active region 150 as it propagates. The vertical laser field 350 clamps the gain of the active region and therefore also the gain of the device to a constant value. The longitudinal mode of the laser field 350 lies in the x direction; the transverse modes lie in the y and z directions. But the transverse modes of the propagating signal 360 lie in the x and y directions. In FIG. 3, the active region 150 and backward diode 160 are finite only in the y direction (relative to the transverse mode of the laser field 350 and/or the transverse mode of the propagating signal 360), but they extend in the z direction. For example, see U.S. patent application Ser. No. 10/014,679, "Integrated Optical Device including a Vertical Lasing Semiconductor Optical Amplifier," by Jeffrey D. Walker and Sol P. Dijaili, filed Dec. 11, 2001, which is incorporated herein by reference.

Figure 4:
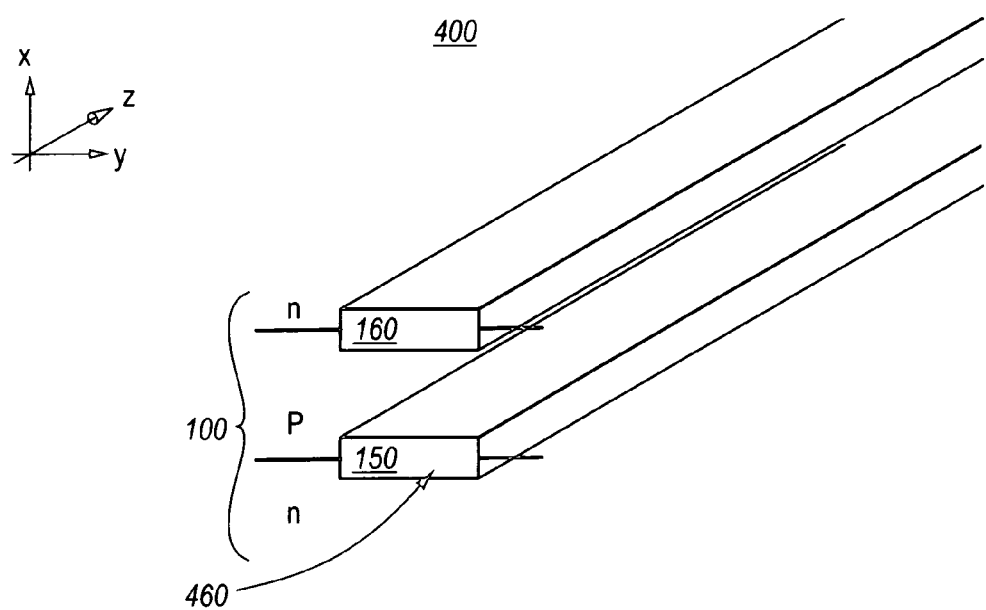
FIG. 4 is a simplified perspective view of a semiconductor optical amplifier using the semiconductor structure of FIG. 1.

The devices are not limited to those with a laser cavity. FIG. 4 is a semiconductor optical amplifier without a laser cavity. The SOA 400 is similar in construction to the VLSOA 300 except that there are no mirrors 320 and 330 to form a laser cavity 310. As a result, there is no laser field 350. Instead, an optical signal 460 propagates along the device in the z direction and is amplified by the active region 150 as it propagates. The gain of the device, however, may not be clamped to a constant value. The active region 150 and backward diode 160 are both finite in the y direction (relative to the transverse mode of the propagating signal 360).

In FIG. 5, the edge-emitting laser 500 includes a longitudinal optical cavity 510 which in this example is formed by two opposing mirrors 520 and 530. The structure 100 is elongated in the z direction and is located in the optical cavity between the two mirrors 520 and 530. The active region 150 provides gain. When the structure 100 is pumped above the lasing threshold, the cavity 510 lases, producing a lasing field 550 within the cavity and a laser output from one of the mirrors. The longitudinal mode of the laser field 550 lies in the z direction; the transverse modes lie in the x and y directions. The active region 150 and backward diode 160 are both finite in the y direction (relative to the transverse mode of the laser field 550).

Applications for structure 100 are not limited to those shown in FIGS. 2–5. For example, the active region 150 may form the gain medium of many different types of laser cavities, not just the ones shown. The laser cavity may be more complex than the two mirror configuration shown. It may also be oriented differently with respect structure 100. In alternate embodiments, the backward diode 160 may not be finite. In two-dimensional cases such as FIG. 2, the backward diode 160 and/or active region 150 may be finite in only one direction. Furthermore, the backward diode 160 may be located on the opposite side of the active region 150 (i.e., the current flows through the active region 150 first and then through the backward diode 160).

Returning to FIG. 1, in one implementation, the semiconductor structure 100 is a layered structure, allowing the structure 100 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others. In one approach, the different features shown in FIG. 1 are planar and built upon a substrate; the backward diode 160 and active region 150 are implemented as buried features.

The choice of materials system for the semiconductor structure 100 will depend in part on the wavelength of the optical signal, which in turn will depend on the application. Wavelengths in the approximately 1.3–1.6 micron region are currently preferred for telecommunications applications, due to the spectral properties of optical fibers. In particular, currently there are two common transmission windows for optical fiber: one at approximately 1.3 micron and another at approximately 1.55 micron. The 1.55 micron window currently can include shorter wavelengths (e.g., the S-band, 1450–1530 nm), centered wavelengths (e.g., C-band 1530–1560 nm), or longer wavelengths (e.g., L-band 1570–1610 nm). In addition, the approximately 1.28–1.35 micron region is currently also preferred for data communications over single mode fiber, with the approximately 0.8–1.1 micron region being an alternate wavelength region. The term "optical" is meant to include all of these wavelength regions.

The active region 150 can be implemented in a number of ways. In one embodiment, the active region 150 includes a multiple quantum well (MQW) active region. MQW structures include several quantum wells and quantum wells have the advantage of enabling the formation of lasers with relatively low threshold currents. In alternate embodiments, the active region 150 may instead be based on a single quantum well or a double-heterostructure active region. The active region 150 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for the surrounding n and p layers 110 and 120 will depend in part on the composition of active region 150.

The backward diode 160 includes two heavily doped, thin layers 162 and 164. Layer 164 is heavily doped n-type and layer 162 is heavily doped p-type. The backward diode 160 is reverse biased but is designed to break down and conduct current from n-side 164 to p-side 162 with a low voltage drop, typically less than 1 volt at a current density of ~5 $kA/cm^2$. The backward diode 160 breaks down, for example, by tunneling breakdown or avalanche breakdown. The doping preferably is optimized using standard techniques to achieve nearly degenerate concentrations (e.g., typically >5E18 cm$^{-3}$) and to minimize diffusion and intermixing across the p-n junction. The heavily doped layers 162,164 are thin (e.g., typically ~10 nm) to minimize optical absorption loss. If the structure 100 is used in a device with a vertical laser field (i.e., laser field in the x direction), the backward diode 160 preferably is located at a node of the laser field in order to further reduce optical loss.

In one implementation, the backward diode 160 includes a Si-doped n++ GaAs layer 164 on the n-side of the junction and a p++ C-doped GaAs layer 162 on the p-side of the junction. As another example, InGaAs can be used in place of GaAs in order to increase the suitability of the backward diode 160 for use in InP-based material systems. Another example uses Si-doped n++ InGaAs 164 on the n-side of the junction and Be-doped p++ InGaAs on the p-side of the junction. The backward diode 160 may be based on other material combinations, including for example Be, Mg and Zn as the p-side dopant; Te, S, Se and Sn as the n-side dopant; and AlGaInAs and InGaAsP as the base material system.

Mirrors and electrical contacts are two other features which are commonly used in devices that might utilize semiconductor structure 100. Examples of top and bottom mirrors for use in vertical laser cavities (e.g., as shown in FIGS. 2 and 3) include Bragg reflectors, non-Bragg reflectors such as metallic mirrors, and hybrid mirrors consisting of a Bragg reflector followed by a metallic mirror. Bragg reflectors may be fabricated using various materials systems, including for example, alternating layers of GaAs and AlAs, SiO$_2$ and TiO$_2$, InAlGaAs and InAlAs, InGaAsP and InP, AlGaAsSb and AlAsSb or GaAs and AlGaAs. Gold is one material suitable for metallic mirrors. Current 190 typically is produced by positioning electrical contacts somewhere on the device and applying a voltage across the contacts. Commonly used materials include titanium, platinum, nickel, germanium, gold, palladium, and aluminum.

FIGS. 6–10 are cross-sections of vertical laser cavities using different implementations of semiconductor structure 100. In these examples, both the backward diode 160 and the active region 150 are buried and the overall device has a planar structure.

Figure 6:
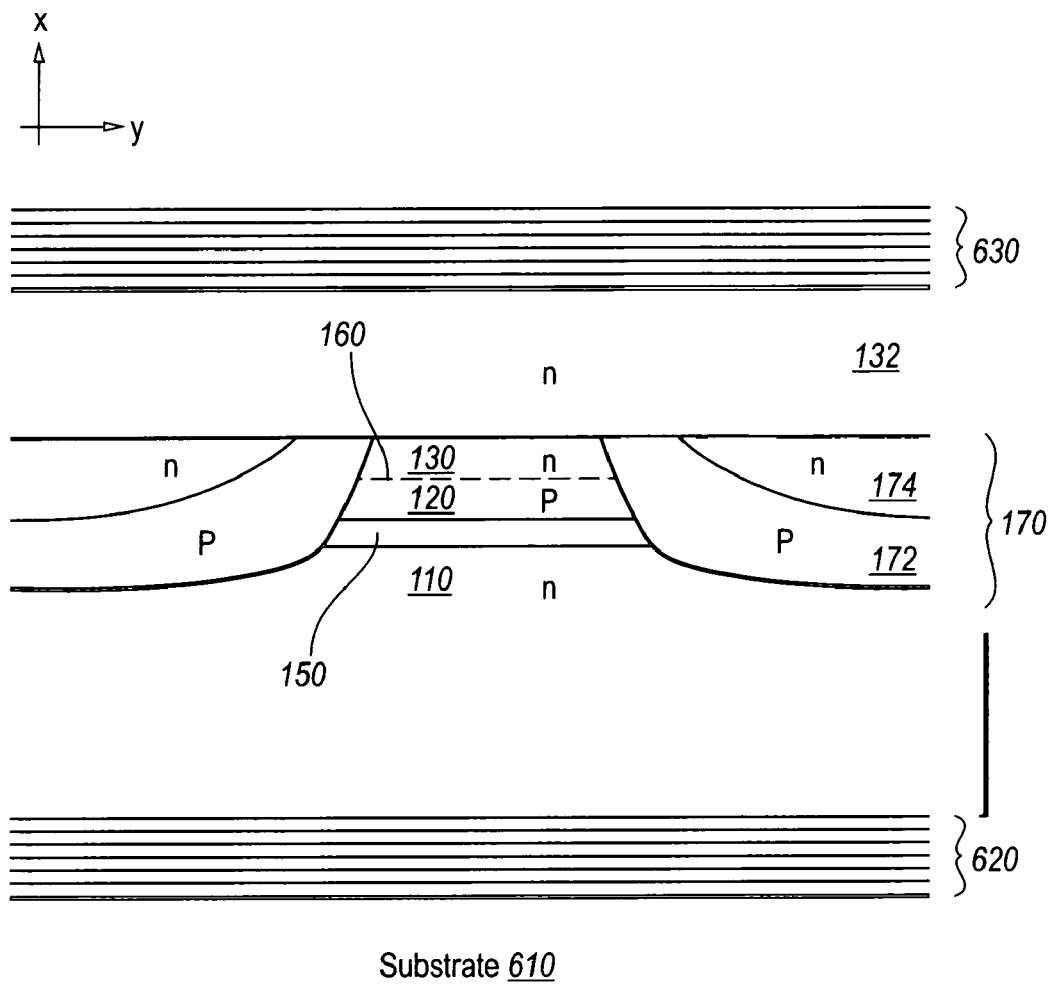
FIGS. 6–10 are cross-sections of vertical laser cavities using different implementations of the semiconductor structure of FIG. 1.

The device in FIG. 6 is fabricated as follows. The process begins with an n-doped substrate 610, which is produced using conventional crystal growing and doping techniques. In a first epitaxy stage, OMCVD is used to grow the following layers: the alternating layers of Bragg reflector 620, n layer 110, active region 150, p layer 120, backward diode 160, and n layer 130. The wafer is then removed and a mask is placed over selected areas of the wafer in order to define the lateral extent of the active region 150 and backward diode 160. Unmasked areas are removed (e.g. with a bromine-based wet chemical etch step), leaving the portions of layers 110, 150, 120, 160 and 130 shown in FIG. 6.

In a second epitaxy stage, the blocking layer 170 is grown. In this example, the blocking layer includes both a p region 172 and an n region 174. The second epitaxy also approximately planarizes the surface. No material grows on top of n layer 130 since it is still masked. The wafer is then removed in order to remove the mask.

In a third epitaxy stage, n layer 132 and Bragg layers for top mirror 630 are grown. The n layer 132 functions as an extension of n layer 130. After this epitaxy stage, a top metal layer is deposited on the Bragg layers to complete the top mirror 630. Electrical contacts (not shown) are also formed. Typically, the entire device is then electrically isolated, preferably either by an isolation etch or by ion implantation.

In one particular design, the vertical laser cavity can be designed for use in either the 1.3 micron or the 1.55 micron window. The substrate 610 is n-doped InP. The Bragg reflector 620 is alternating layers of InP and InGaAsP. The n layer 110 is n-doped InP, the active region 150 is either InGaAsP or InAlGaAs, and the p layer 120 is p-doped InP. The backward diode 160 is C-doped tensile-strained InGaAs on the p-side and Te-doped InGaAs on the n-side. The layers 130 and 132 are n-doped InP and top mirror 630 is an n doped Bragg reflector of InP/InGaAsP. The layers 110, 150, 120 and 130 are etched using a bromine-based wet etch process and then replaced by current blocking layer 170, which is a pn structure using p-doped InP and n-doped InP (or a semi-insulating InP layer in FIG. 7). The top mirror 630 can be curved, as described in U.S. Patent Application Ser. No. 10/392,671, "Vertical Laser Cavity with a Non-Planar Top Mirror," filed by Daniel A. Francis and Chris Decker on the same date as this application, and which is incorporated by reference herein.

Figure 7:
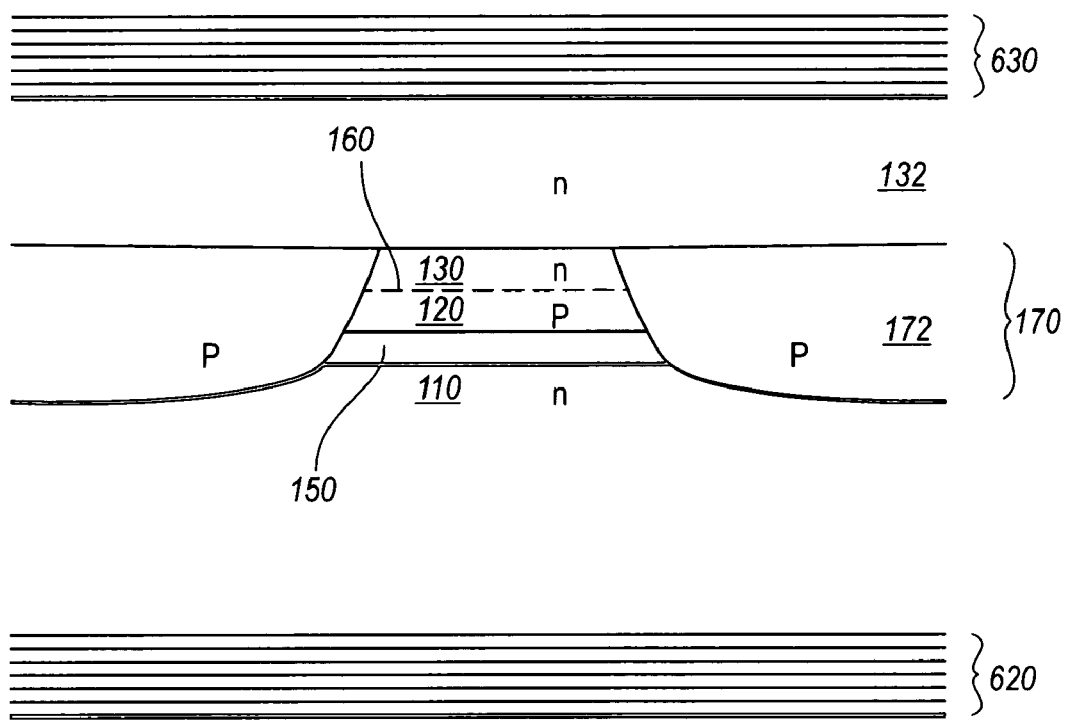

FIG. 7 is similar to FIG. 6, except that the blocking layer 170 includes only p material 172, rather than a combination of p and n materials 172 and 174. In an alternate embodiment, the blocking layer 170 is implemented by growing a layer with high electrical resistance (e.g., iron doped InP). In other implementations, the blocking layer is implemented by implantation techniques (e.g., proton or oxygen).

Figure 8:
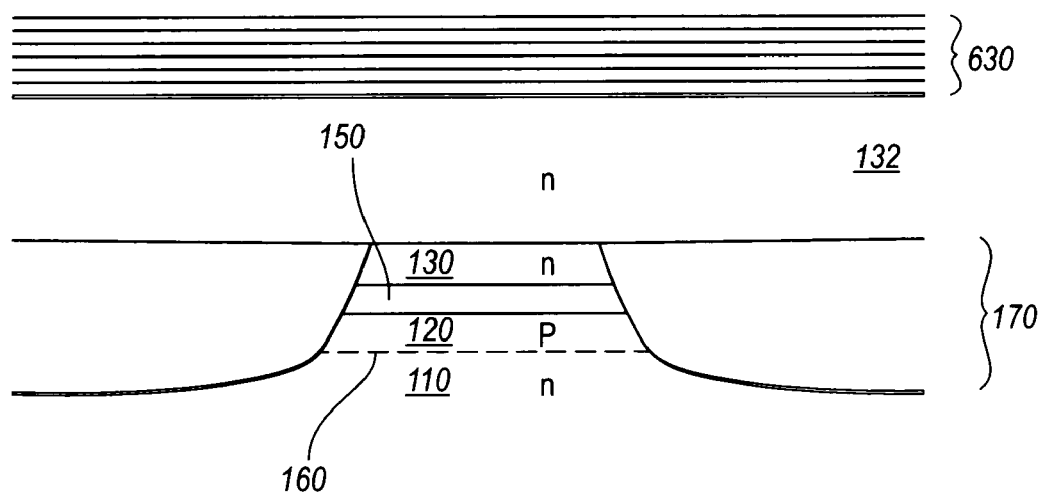

FIG. 8 is similar to FIG. 6, except that the order of the active region 150 and backward diode 160 are reversed. In other words, from bottom up, the layers are n layer 110, backward diode 160, p layer 120, active region 150, and n layer 130.

Figure 9:
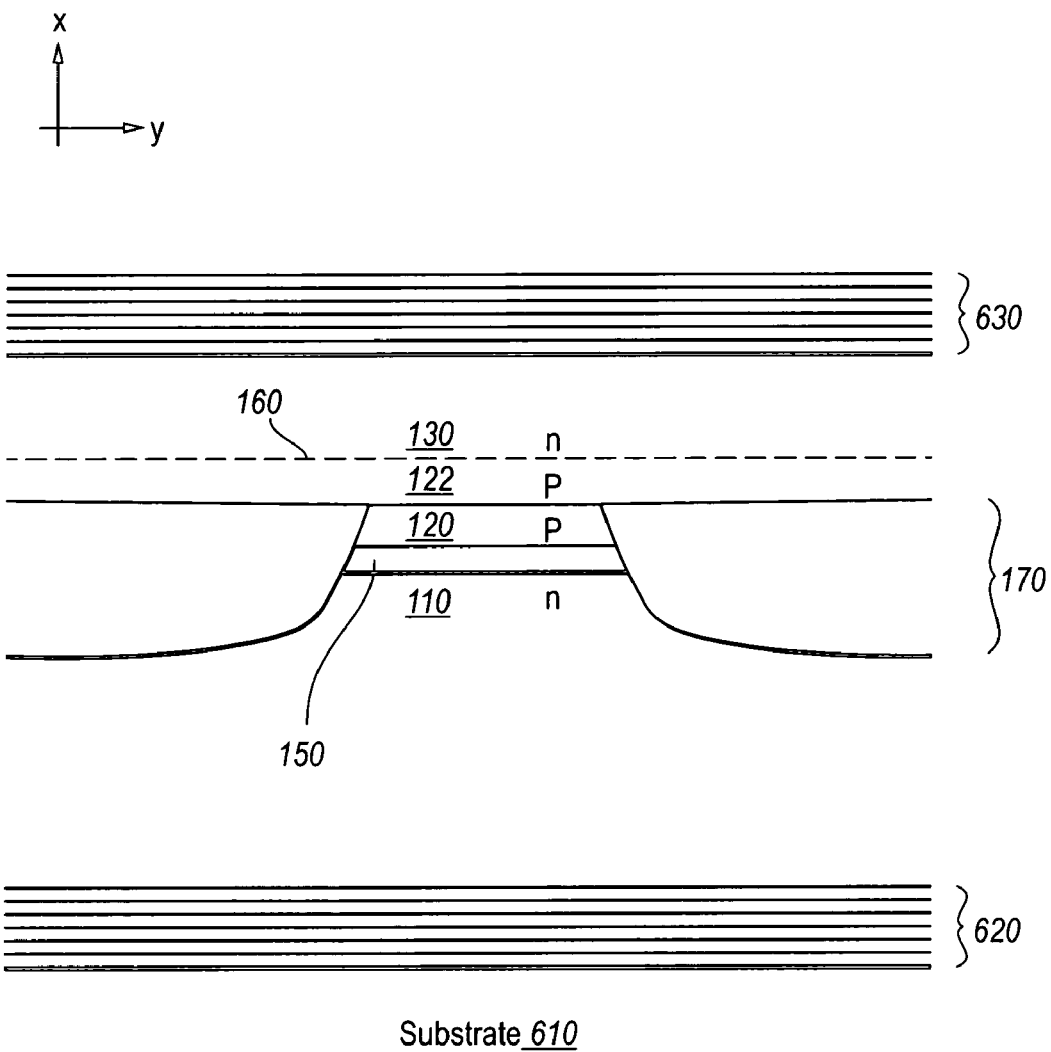
Figure 10:
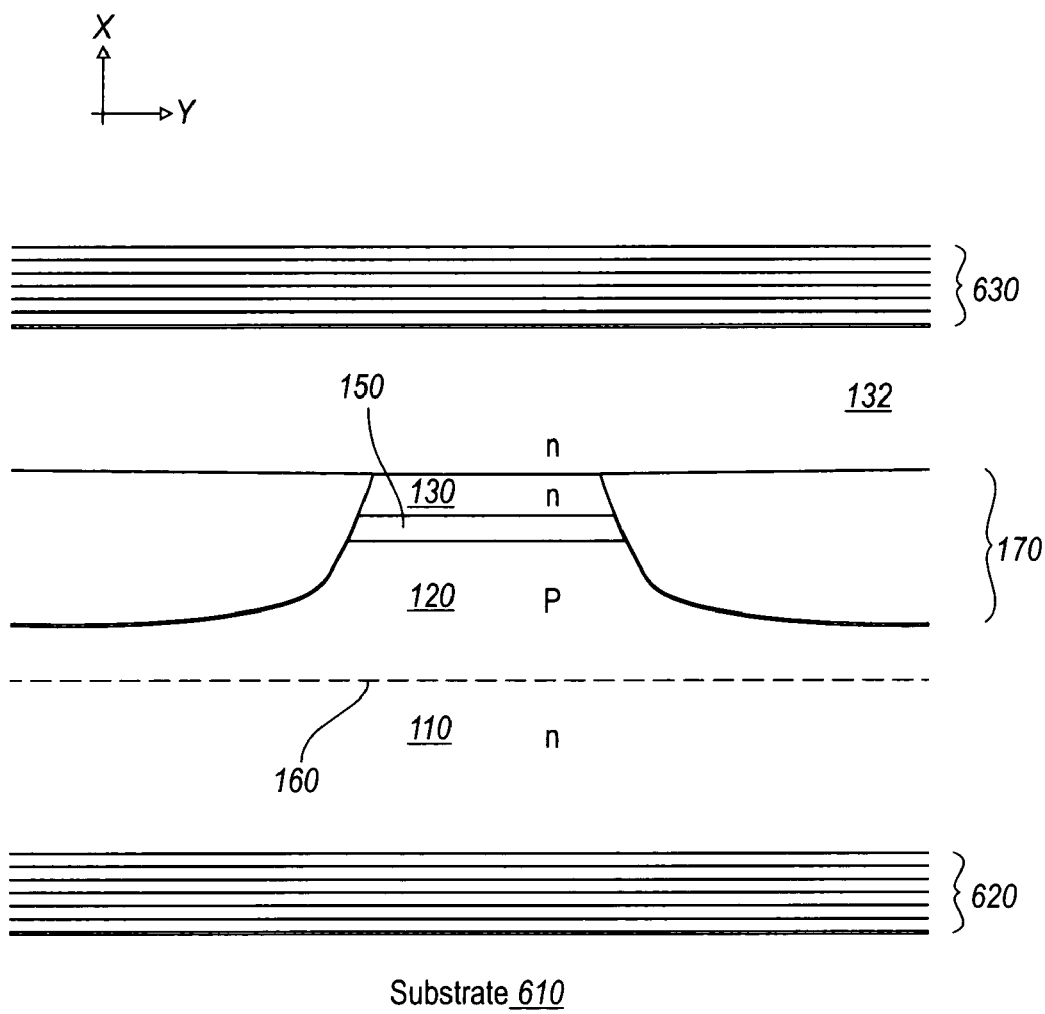

In FIGS. 9 and 10, the backward diode 160 is not finite in extent. In FIG. 9, the backward diode 160 is grown as part of the third epitaxy stage (which now also includes a p layer 122 as an extension of p layer 120). FIG. 10 is similar to FIG. 8, but the etch does not extend to the backward diode 160. Thus, active region 150 is finite but backward diode 160 is not.

Although the invention has been described in considerable detail with reference to certain preferred embodiments thereof, other embodiments will be apparent. For example, all of the above semiconductor structures 100 are based on n-p-n layers. Other implementations can be based on p-n-p layers instead.

What is claimed is:

1. An optical device comprising:
   a primarily vertical current path for electrical current;
   a semiconductor active region located in the current path and having a finite extent along at least one lateral dimension, the electrical current for pumping the semiconductor active region to produce emission of photons;
   a backward diode located in the current path; and
   a substrate, wherein the semiconductor active region and the backward diode are integrated on the substrate.

2. The optical device of claim 1 further comprising, in the following vertical order:
   a first n-doped semiconductor region;
   a p-doped semiconductor region; and
   a second n-doped semiconductor region;
   wherein the semiconductor active region is located between the p-doped semiconductor region and one of the n-doped semiconductor regions, and the backward diode is located between the p-doped semiconductor region and the other of the n-doped semiconductor regions.

3. The optical device of claim 2 wherein the backward diode comprises:
   a heavily p-doped layer in contact with a heavily n-doped layer, the heavily p-doped layer also in contact with the p-doped semiconductor region and the heavily n-doped layer also in contact with the n-doped semiconductor region.

4. The optical device of claim 1 further comprising, in the following order along a vertical direction away from the substrate:
   a first n-doped semiconductor layer;
   a first p-doped semiconductor layer, the semiconductor active region located between the first n-doped semiconductor layer and the first p-doped semiconductor layer;
   a second n-doped semiconductor layer, the backward diode located between the first p-doped semiconductor layer and the second n-doped semiconductor layer, wherein the semiconductor active region, the first p-doped semiconductor layer, the backward diode and the second n-doped semiconductor layer all have a similar lateral extent; and
   a third n-doped semiconductor layer.

5. The optical device of claim 1 further comprising, in the following order along a vertical direction away from the substrate:
   a first n-doped semiconductor layer;
   a first p-doped semiconductor layer, the backward diode located between the first n-doped semiconductor layer and the first p-doped semiconductor layer;
   a second n-doped semiconductor layer, the semiconductor active region located between the first p-doped semiconductor layer and the second n-doped semiconductor layer, wherein the backward diode, the first p-doped semiconductor layer, the semiconductor active region and the second n-doped semiconductor layer all have a similar lateral extent; and
   a third n-doped semiconductor layer.

6. The optical device of claim 1 further comprising, in the following order along a vertical direction away from the substrate:
   a first n-doped semiconductor layer;
   a first p-doped semiconductor layer, the semiconductor active region located between the first n-doped semiconductor layer and the first p-doped semiconductor layer, wherein the semiconductor active region and the first p-doped semiconductor layer all have a similar lateral extent;
   a second p-doped semiconductor layer; and
   a second n-doped semiconductor layer, the backward diode having an infinite lateral extent and located between the second p-doped semiconductor layer and the second n-doped semiconductor layer.

7. The optical device of claim 1 further comprising, in the following order along a vertical direction away from the substrate:
   a first n-doped semiconductor layer;
   a first p-doped semiconductor layer, the backward diode having an infinite lateral extent and located between the first n-doped semiconductor layer and the first p-doped semiconductor layer;
   a second n-doped semiconductor layer, the semiconductor active region located between the first p-doped semiconductor layer and the second n-doped semiconductor layer, wherein the semiconductor active region and the second n-doped semiconductor layer have a similar lateral extent; and
   a third n-doped semiconductor layer.

8. The optical device of claim 1 wherein the semiconductor active region has a finite extent along one lateral dimension and is extended along another lateral dimension.

9. The optical device of claim 1 wherein the semiconductor active region has a finite extent along two lateral dimensions.

10. The optical device of claim 1 wherein:
   the optical device supports an optical mode characterized by a lateral mode width along the at least one lateral dimension; and
   a width of the semiconductor active region along the at least one lateral dimension is equal to or less than the lateral mode width.

11. The optical device of claim 1 wherein the backward diode is located before the semiconductor active region in the current path.

12. The optical device of claim 1 wherein the backward diode is located after the semiconductor active region in the current path.

13. The optical device of claim 1 wherein the backward diode has a finite extent along the at least one lateral dimension.

14. The optical device of claim 1 further comprising:
   a current blocking layer laterally adjacent to the semiconductor active region.

15. The optical device of claim 1 further comprising:
   a bottom mirror and a top mirror forming a vertical laser cavity, the semiconductor active region and the backward diode located in the vertical laser cavity.

16. The optical device of claim 15 wherein the active region has a lateral extent that supports only a single transverse mode of the vertical laser cavity.

17. The optical device of claim 15 wherein the backward diode is located at an optical null of the vertical laser cavity.

18. The optical device of claim 1 wherein the semiconductor active region acts as a waveguide for the optical device.

19. The optical device of claim 18 wherein the semiconductor active region has a lateral extent that supports only a single transverse mode of the waveguide.

20. The optical device of claim 18 further comprising:
   two end mirrors forming a longitudinal laser cavity, the semiconductor active region located in the longitudinal laser cavity.

21. The optical device of claim 18 wherein the emission of photons amplifies an optical signal propagating along the waveguide.

22. The optical device of claim 1 further comprising:
   a bottom mirror and a top mirror forming a vertical laser cavity, the semiconductor active region and the backward diode located in the vertical laser cavity;
   wherein the semiconductor active region acts as a waveguide for the optical device, the vertical laser cavity gain clamps a gain of the semiconductor active region, and the emission of photons amplifies an optical signal propagating along the waveguide.

23. The optical device of claim 1 wherein the lateral extent of the semiconductor active region is less than five microns.

24. The optical device of claim 1 wherein the substrate is an InP substrate.

25. The optical device of claim 1 wherein the optical device operates within the 1.3 micron or within the 1.55 micron wavelength windows.

* * * * *